(12) United States Patent
Takagi et al.

(10) Patent No.: US 8,961,279 B2
(45) Date of Patent: Feb. 24, 2015

(54) AIR CONDITIONING SYSTEM

(75) Inventors: Yasuo Takagi, Chigasaki (JP); Dai Murayama, Musashino (JP); Yuuichi Hanada, Saitama (JP); Hideyoshi Ootani, Chiba (JP); Tomoyuki Kinoshita, Yokohama (JP); Hiroshi Morimoto, Minato-ku (JP); Koubun Takahashi, Minato-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 642 days.

(21) Appl. No.: 13/213,423

(22) Filed: Aug. 19, 2011

(65) Prior Publication Data
US 2011/0306287 A1  Dec. 15, 2011

Related U.S. Application Data

(63) Continuation of application No. PCT/JP2011/060734, filed on May 10, 2011.

(30) Foreign Application Priority Data

May 14, 2010 (JP) ................. P2010-112547

(51) Int. Cl.
*H05K 5/02* (2006.01)
*F24F 11/00* (2006.01)
*H05K 7/20* (2006.01)

(52) U.S. Cl.
CPC ........ *F24F 11/0079* (2013.01); *H05K 7/20745* (2013.01); *H05K 7/20836* (2013.01); *F24F 2011/0046* (2013.01); *F24F 2011/0047* (2013.01); *Y02B 30/746* (2013.01)
USPC .......................................... 454/184; 361/695

(58) Field of Classification Search
CPC ............. F24F 7/06; F24F 11/02; F24F 11/04; F24F 2011/0013; F24F 2011/0016; F24F 12/006; F24F 3/14; H05K 7/20745; H05K 7/20836; H05K 5/0213
USPC ......... 454/184, 187, 224, 229, 231–234, 236, 454/239, 241–242, 249, 251, 261; 62/259.2; 165/224, 249, 251, 252
See application file for complete search history.

(56) References Cited

U.S. PATENT DOCUMENTS

2004/0099747 A1   5/2004   Johnson et al.
2005/0159099 A1*  7/2005   Malone ................. 454/186
(Continued)

FOREIGN PATENT DOCUMENTS

CN   2064029   10/1990
JP   6-82088   3/1994
(Continued)

OTHER PUBLICATIONS

Notice of Reasons for Refusal issued by the Japanese Patent Office on Jun. 26, 2012, in Japanese Patent Application No. 2010-112547, and English-language translation thereof.
(Continued)

*Primary Examiner* — Kang Hu
*Assistant Examiner* — Dana Tighe
(74) *Attorney, Agent, or Firm* — Finnegan, Henderson, Farabow, Garrett & Dunner, L.L.P.

(57) ABSTRACT

Some embodiment includes an air conditioner, an air blower, a sensor, and a controller. The air conditioner works for supply to cold spaces. The air blower produces streams of air in and between a server room and an air conditioning system. The sensor takes a measure of current or power as consumption at servers. The controller operates on the measure at the sensor, to control the air blower.

1 Claim, 3 Drawing Sheets

(56) References Cited

U.S. PATENT DOCUMENTS

| | | |
|---|---|---|
| 2006/0168975 A1* | 8/2006 | Malone et al. .................. 62/180 |
| 2008/0055850 A1* | 3/2008 | Carlson et al. ................ 361/695 |
| 2008/0098763 A1 | 5/2008 | Yamaoka |
| 2008/0185446 A1* | 8/2008 | Tozer ........................... 236/49.4 |
| 2009/0171512 A1* | 7/2009 | Duncan ......................... 700/300 |

FOREIGN PATENT DOCUMENTS

| | | |
|---|---|---|
| JP | 9-126523 | 5/1997 |
| JP | 2004-286365 | 10/2004 |
| JP | 2005-172309 | 6/2005 |
| JP | 2005-260148 | 9/2005 |
| JP | 2008-111588 | 5/2008 |
| JP | 2010-43817 | 2/2010 |
| JP | 2010-79919 | 4/2010 |
| JP | 2010-108324 | 5/2010 |
| JP | 2011-123547 | 6/2011 |

OTHER PUBLICATIONS

International Search Report issued by the Japanese Patent Office on Aug. 9, 2011, for International Application No. PCT/JP2011/060734.

Notice of Reasons for Refusal issued by the Japanese Patent Office on Jul. 16, 2013, in Japanese Patent Application No. 2012-184097, and English-language translation thereof.

Notification of Reasons for Refusal issued by the State Intellectual Property of the People's Republic of China on Aug. 25, 2014, for Chinese Patent Application No. 201180001091.5, and English-language summary thereof.

* cited by examiner

AIR CONDITIONING SYSTEM

CROSS-REFERENCE TO RELATED APPLICATION

This application is a Continuation of PCT Application No. PCT/JP2011/060734, filed on May 10, 2011, and claims the priority of Japanese Patent Application No. 2010-112547, filed on May 14, 2010, the contents of both of which are incorporated herein by reference.

FIELD

Embodiments described herein relate generally to an air conditioning system adapted to control a server room accommodating servers thererin, within a prescribed range of temperatures.

BACKGROUND

Using a room as a server room, there can be computing machines such as servers installed in the room. Providing the computing machines are servers, for instance, such the server room is referred to as a data center. Such computing machines dissipate heat while working. If installed servers increase in number, like the case of data center, the whole servers have increased heat dissipation, so there is use of an air conditioner for producing cold air, to supply to a data center, by blowing up from under the floor, for instance. Further, there are fans provided to servers, or for racks accommodating servers therein, and adapted to intake cold air for cooling servers. There are fluxes of air warmed by servers being cooled, and let out of servers, to discharge as return air from the data center. Flux of return air discharged from the data center may be cooled at the air conditioner, to again provide to the data center, or discharged outdoor, as evacuation of air.

For such an air conditioning of data center, there was a technique using a set of racks of a type that accommodated therein a server or servers and took in cold air at the front side to let out as return air through the upside or the back, and a set of roundabout preventing devices each preventing streams of return air from going roundabout toward the front side. For instance, this might be a set of shield plates fixed to upsides of racks to prevent return air from mixing with cold air, allowing for effective use of cold air.

Also, there was a technique using an air blowing fan improved for efficient cooling. It employed a fan tower (as an air blowing device) installed in a server room, and configured to have fluxes of air suctioned from lower spatial regions in the room, to blow out into upper spatial regions, so air was suctioned into upper portions of racks. In this configuration, the air blowing device served to send cold air in a lower space in the room to an upper space, so those fluxes of air being suctioned from the upper space had lower temperatures than ever. Further, racks had decreased fluxes of cold air in their lower portions, where temperatures were raised higher than ever, so as a whole, they had reduced temperature gradients in the vertical direction, with reduced variations in temperature of suctioned air. In addition, their bottoms had openings formed therethrough, with adjusters operable to open and close, affording to suppress variations in temperature of cold air, allowing for saved energy, as well.

However, those techniques in the past had fluxes of air delivered from fans to supply to racks, driven by fans at the racks to blow onto servers, cooling them, discharged as fluxes of return air from the racks, and suctioned by a return air fan at an air conditioner, without mixing with cold air. That is, there was a connected single-duct configuration having those air streams striking therethrough, though there being the air conditioner and servers as flow passage resistances. On the other hand, for the single-duct configuration, there was use of fans forcing air therethrough, with actions of the fans interfering with each other, not simply causing air streams to be unstable, but also consuming undue power, as an issue.

Further, for such fans, there was use of speed uncontrollable induction motors affording to have equilibrium flux converged in accordance with a balance of air flow between the fans. However, for fans put under an inverter revolution number control, there were revolution numbers insisted in between, with their situations of revolution number control interfering with each other, causing hunting, as another issue.

DETAILED DESCRIPTION

According to one embodiment, an air conditioning system includes an air conditioner, an air blower, a sensor, and a controller. The air conditioner works for supply to cold spaces. The air blower produces streams of air in and between a server room and the air conditioning system. The sensor takes a measure of current or power as consumption at servers. The controller operates on the measure at the sensor, to control the air blower.

There will be described air conditioning systems according to certain embodiments, with reference to the drawings. In the description below, like configurations are designated by like signs, omitting redundancy.

First Embodiment

Figure 1:
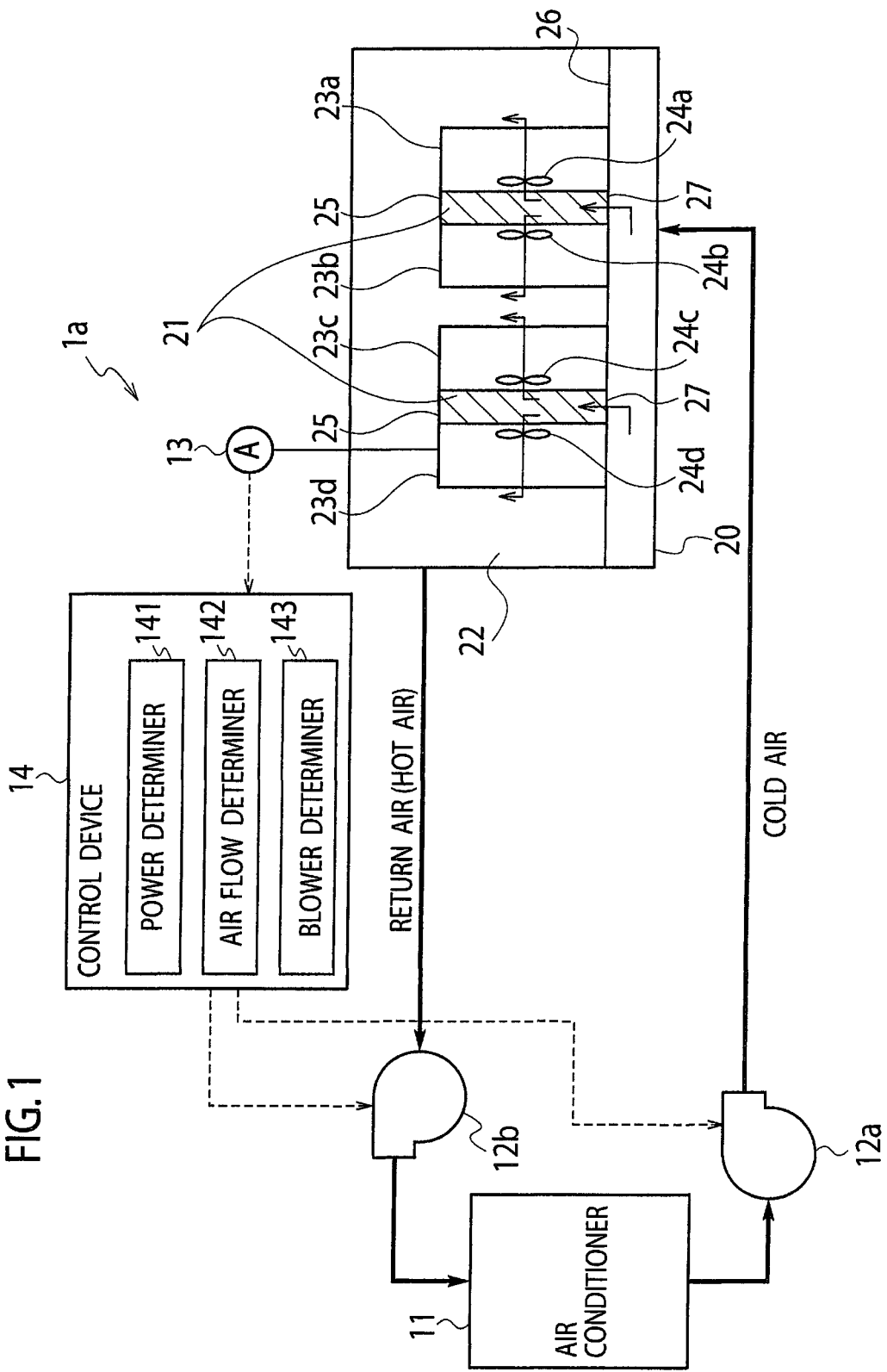
FIG. 1 is a diagram of entirety of an air conditioning system according to a first embodiment.

As shown in FIG. 1, according to a first embodiment, there is an air conditioning system 1a configured to control supplying cold air for a cooling service to a server room 20, which has installed therein a set of computing machines such as servers that dissipate running heat.

The server room 20 has therein a combination of hot area or space 22 and cold areas or spaces 21 defined as different spaces. More specifically, the server room 20 is separated into a hot space 22 and a set of cold spaces 21, by provision of racks 23 (23a, 23b, 23c, 23d) with closure plates 25, the racks 23 serving for accommodation of computing machines such as servers (non-depicted).

There are fans 24 (24a, 24b, 24c, 24d) each provided to a rack 23 or for a server. The racks 23 as well as servers are each arranged for use of revolutions of a fan 24 to take in cold air residing in a cold space 21, cooling a server working with heat dissipation, to let out as heated return air to the hot space 22. In the example illustrated in FIG. 1, where the racks 23 are mounted on a floor 26 that is double floored for under floor distribution of cold air from air conditioner, for instance, there are arrays of openings 27 formed in the floor 26, each in position to supply cold air to a cold space 21 defined by and between racks arranged with their air intake sides opposing each other, so cold air is let into the racks 23, causing such streams of return air as outflowing to the hot space 22.

As illustrated in FIG. 1, the air conditioning system 1a includes an air conditioner 11 operable for cooling air to supply cold air to the set of cold spaces 21, a first blower 12a operable to send cold air cooled at the air conditioner 11, to the server room 20, a second blower 12b operable to send return air discharged from the hot space 22, to the air conditioner 11, an ammeter 13 adapted to take a measure of current as consumption at servers in the server room 20, and a control device 14 configured for operations based on a measure at the ammeter 13 to control the blowers 12a and 12b.

Such being the case, the air conditioning system 1a is adapted to have cold air, as it is cooled at the air conditioner 11, sent by the first blower 12a to the server room 20, and discharged as return air from the server room 20, to again cool at the air conditioner 11, to circulate to the server room 20, allowing for servers to be kept normal. If servers bear increased loads, the servers' heat dissipation increases, with an accompanying increase in revolution number of fans 24, as well. As the revolution number of fans 24 increases, there are increased fluxes of air as gaseous body moving from the cold spaces 21 to the hot space 22, with the need to send increased fluxes of cold air to the cold spaces 21. It also is needed to send an increased flux of return air from the hot space 22 to the air conditioner 11, to circulate a stable flux of air in the air conditioning system 1a.

Therefore, the control device 14 is adapted for use of the ammeter 13 to predict a load on servers, for operations depending on the load on servers to control the blowers 12a and 12b, to have an adjusted flux of air circulating in the air conditioning system 1a. More specifically, the control device 14 includes a power determiner 141 configured to input a current value as a measure from the ammeter 13, for operation to determine power consumption of servers from the current value. More specifically, the power determiner 141 has a mathematical expression or table set stored therein in advance for determination of power consumption, and is adapted for use of the mathematical expression or table set to determine power consumption from current value.

Figure 2:
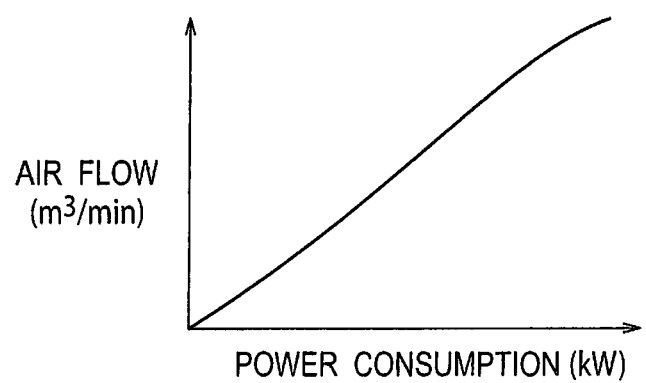
FIG. 2 is a graph showing a relationship between air flow and power consumption employed in the air conditioning system in FIG. 1.

This is followed by operation of an air flow determiner 142, which is configured to operate on power consumption determined at the power determiner 141, to determine therefrom an air flow produced by the fans 24. To have a stable flux of air circulating between the air conditioning system 1a and the server room 20, there should be an air flow produced by the first blower 12a to be consistent with fluxes of air produced by the fans 24, as well as an air flow produced by the second blower 12b. More specifically, there is a relationship between air flow and power consumption, indicative as illustrated in FIG. 2, so the air flow determiner 142 has a mathematical expression or table set stored therein in advance for determination of air flow, and is adapted for use of the mathematical expression or table set to determine an air flow from power consumption. The air flow thus determined constitutes a target air flow of blowers 12a and 12b.

Figure 3:
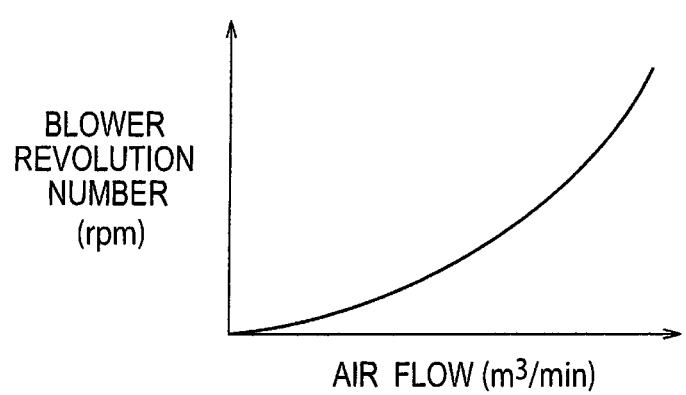
FIG. 3 is a graph showing a relationship between blower revolution number and air flow employed in the air conditioning system in FIG. 1.

This is followed by operation of a blower controller 143, which is configured to determine a revolution number of the blowers 12a and 12b, as it is required for the blowers 12a and 12b to produce the target air flow determined at the air flow determiner 142, for use of the revolution number to thereby control the blowers 12a and 12b. More specifically, there is a relationship between blower revolution number and air flow, indicative as illustrated in FIG. 3, so the blower controller 143 has a mathematical expression or table set stored therein in advance for determination of revolution number, and is adapted for use of the mathematical expression or table set to determine a revolution number from air flow. For control of blowers 12a and 12b to be implemented by controlling revolution number of an inverter, for instance, the above-determined revolution number constitutes a revolution number for revolution number control of the inverter.

It is noted that instead of the ammeter 13, there may be use of a power meter for measuring power consumption of servers. For use of a power meter, as the power determiner 141 is unnecessary, the air flow determiner 142 may be adapted to determine an air flow by using a measure of power consumption at the power meter.

Further, in FIG. 1, the air conditioning system 1a has two blowers 12a and 12b implemented as air blowers for producing streams of air in and between the air conditioning system 1a and the server room 20, while there is no limitation to the number of air blowers, so this may be one or two or more, subject to streams of air to be produced in and between the air conditioning system 1a and the server room 20.

As described, the air conditioning system 1a according to the first embodiment is adapted to work in accordance with fluxes of air by fans 24, to control the blowers 12a and 12b for air flow adjustment, permitting streams of air to be stable without interferences between actions of blowers 12a and 12b and fans 24, allowing for saved undue consumption of power. Further, it can prevent hunting even in the inverter revolution number control mode.

Modification

Further, the air conditioning system 1a may employ, besides the ammeter 13 or power meter, an air flow meter (non-depicted) for measuring, among others, a flow rate of cold air flowing into the first blower 12a or a flow rate of return air flowing into the second blower 12b. For use of air flow meters, the blower controller 143 may be adapted for feedback control to establish prescribed deviations between measures at the air flow meters and a target air flow of blowers 12a and 12b determined at the air flow determiner 142.

More specifically, the blower controller 143 may be adapted for feedback control of the second blower 12b to establish a prescribed deviation between a value of air flow measured at a first air flow meter (non-depicted) installed upstream of the first blower 12a and a target air flow of the second blower 12b determined at the air flow determiner 142. Also, the blower controller 143 may be adapted for feedback control of the first blower 12a to establish a prescribed deviation between a value of air flow measured at a second air flow meter (non-depicted) installed upstream of the second blower 12b and a target air flow of the first blower 12a determined at the air flow determiner 142. The blower controller 143 then used may be a proportional control.

Second Embodiment

Figure 4:
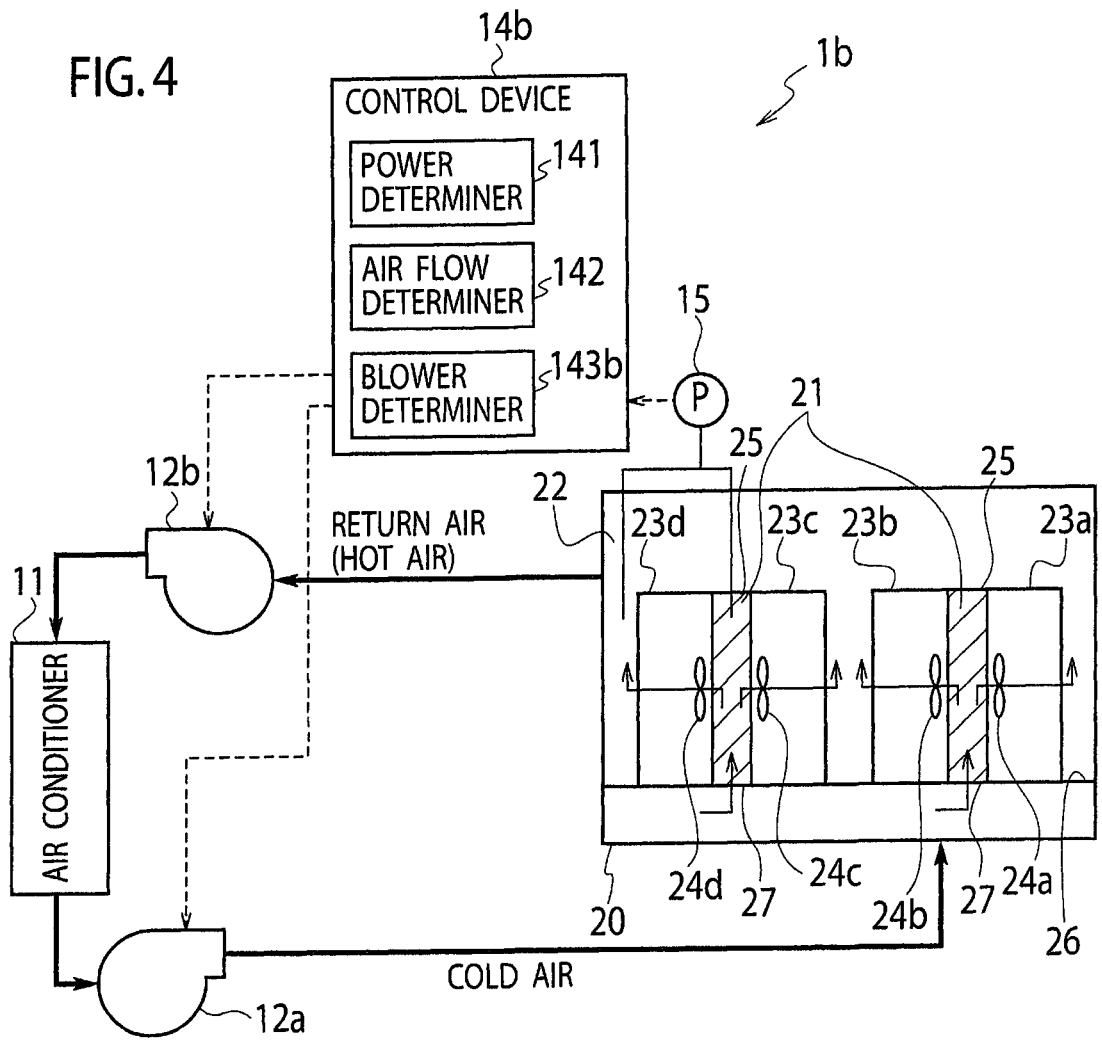
FIG. 4 is a diagram of entirety of an air conditioning system according to a second embodiment.

FIG. 4 shows an air conditioning system 1b according to a second embodiment, which is different from the air conditioning system 1a described with reference to FIG. 1, in that it includes a differential pressure meter 15 substituting for the ammeter 13 to measure a differential pressure between a cold space 21 and a hot space 22, and a control device 14b substituting for the control device 14 to make use of a measure at the differential pressure meter 15 to control blowers 12a and 12b. The rest of configuration of the air conditioning system 1b is similar to the air conditioning system 1a, and is adapted for use of cold air produced at an air conditioner 11 for cooling servers dissipating heat in a server room 20, while circulating return air to the air conditioner 11, for circulation of air as gaseous body in and between the air conditioning system 1b and the server room 20.

There are changes in revolution number of fans 24 causing changes in flux of air moving from cold spaces 21 to the hot space 22, with a difference developed between flux of cold air being supplied to the cold spaces 21 and flux of return air being discharged from the hot space 22, which difference may be increased, with increased differences between pressures in the cold spaces 21 and pressures in the hot space 22, as well. In situations differential pressures increase between the cold spaces 21 and the hot space 22, the air conditioning system 1b has streams of air getting unstable in its entirety, so the control device 14b makes use of a measure at the differential pressure meter 15 to control the blowers 12a and 12b.

More specifically, the control device 14b incudes a blower controller 143b, which is adapted to input thereto a measure of the differential pressure meter 15 as a value of differential pressure between the cold spaces 12 and the hot space 22, and compare the differential pressure value with a target differential pressure that is a prescribed target value of differential pressure, to operate when the measure of differential pressure meter 15 is larger than the target differential pressure, to decrease revolution numbers of the blowers 12a and 12b. On the other hand, if the measure of differential pressure meter 15 is smaller than the target differential pressure, the blower controller 143b operates to increase revolution numbers of the blowers 12a and 12b. This example implements a proportional control for changing the revolution numbers.

Figure 5:
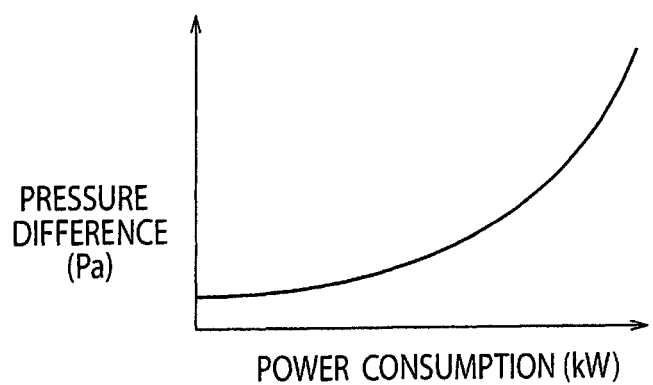
FIG. 5 is a graph showing a relationship between pressure difference and power consumption employed in the air conditioning system in FIG. 4.

In this case, the target value of differential pressure is determined using a relationship between differential pressure and power consumption. The relationship between differential pressure and power consumption is indicative as illustrated in FIG. 5, for instance, so the blower controller 143b is configured to have a mathematical expression or table set stored therein in advance for determination of a certain target value of differential pressure, and is adapted for use of the mathematical expression or table set to determine a target value of differential pressure from power consumption of servers in the server room 20. In other words, the air conditioning system 1b includes an ammeter for taking a measure of current, or a power meter for taking a measure of power, as consumption at servers, and the blower controller 143b is adapted to operate on such a measure of current or power, to determine a target value of differential pressure, for comparison between the target value thus determined and a measured value, to control the blowers 12a and 12b.

In an exemplary situation where the air conditioning system 1b has no measures (such as a voltmeter or ammeter 13, power determiner 141, air flow determiner 142) for services to measure power consumption in the server room and determine a target value of differential pressure, the blower controller 143b may be configured to have a target differential pressure as a prescribed value preset thereto, to use the value anytime irrespective of power consumption.

Further, the air conditioning system 1b may have a differential pressure meter 15 adapted not for the service to measure a differential pressure as it is between a cold space or cold spaces 21 and the hot space 22, but for a service to measure a differential pressure as it is between a region or regions in a server or servers and the hot space 22, or a differential pressure as it is between a space or spaces in a rack or racks 23 and the hot space 22, in combination with a power determiner 141b adapted to determine power consumption from such a measure of differential pressure, for operations thereon to control the blowers 12a and 12b, allowing for similar effects to be obtained.

As described, the air conditioning system 1b according to the second embodiment is adapted to work in accordance with fluxes of air by fans 24, to control the blowers 12a and 12b for air flow adjustment, permitting streams of air to be stable without interferences between actions of blowers 12a and 12b and fans 24, allowing for saved undue consumption of power. Further, it can prevent hunting even in an inverter revolution number control mode. It is noted that even in failure of a fan or fans 24 for any server or servers still running, there may be use of a differential pressure, for operations to control the blowers 12a and 12b to produce streams of air as necessary, affording to ensure required air fluxes.

As described, the techniques in the past employed fans as air blowing elements operable with, among others, interfering actions, causing unstable air streams consuming undue power, and hunting, as issues.

In view of the foregoing issues, embodiments herein provide an air conditioning system adapted for stable control of air blowing elements to implement an energy saving.

While certain embodiments have been described, these embodiments have been presented by way of example only, and are not intended to limit the scope of inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An air conditioning system connected to a server room, the server room being configured with a cold space and a hot space separated from each other, and the server room including a server disposed between the cold space and the hot space, to have cold air supplied through the cold space, heated by dissipation of heat at the server, and discharged as return air through the hot space, the air conditioning system comprising:
  an air conditioner configured to send cold air to supply to the cold space;
  an air blower configured to produce streams of air in and between the server room and the air conditioning system;
  a first sensor configured to measure a differential pressure between one of the cold space and the hot space, or the hot space and a region in the server or a space in a rack accommodating the server;
  a second sensor configured to provide as output a measure of at least one of current or power supplied to the server; and
  a controller configured to:
    determine a target differential pressure based on the second sensor output;
    compare the measured differential pressure with the target differential pressure, and
    decrease revolution numbers of the air blower when the measured differential pressure is larger than the target differential pressure.

* * * * *